United States Patent
Zhao et al.

(10) Patent No.: US 10,249,744 B2
(45) Date of Patent: Apr. 2, 2019

(54) TUNNEL FIELD-EFFECT TRANSISTOR AND METHOD FOR MANUFACTURING TUNNEL FIELD-EFFECT TRANSISTOR

(71) Applicant: HUAWEI TECHNOLOGIES CO., LTD., Shenzhen, Guangdong (CN)

(72) Inventors: Jing Zhao, Shenzhen (CN); Chen-Xiong Zhang, Plano, TX (US)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 15/977,309

(22) Filed: May 11, 2018

(65) Prior Publication Data

US 2018/0261689 A1    Sep. 13, 2018

Related U.S. Application Data

(63) Continuation of application No. PCT/CN2015/094590, filed on Nov. 13, 2015.

(51) Int. Cl.
*H01L 29/78* (2006.01)
*H01L 29/66* (2006.01)
(Continued)

(52) U.S. Cl.
CPC .. *H01L 29/66977* (2013.01); *H01L 21/02293* (2013.01); *H01L 21/31111* (2013.01);
(Continued)

(58) Field of Classification Search
CPC ......... H01L 29/66977; H01L 29/78696; H01L 29/78642; H01L 21/31144;
(Continued)

(56) References Cited

U.S. PATENT DOCUMENTS

2011/0315960 A1    12/2011   Goel et al.
2012/0113726 A1     5/2012   Huang et al.
(Continued)

FOREIGN PATENT DOCUMENTS

CN    102272933 A    12/2011
CN    102456745 A     5/2012
(Continued)

OTHER PUBLICATIONS

International Search Report dated Aug. 24, 2016 in corresponding International Patent Application No. PCT/CN2015/094590.
(Continued)

*Primary Examiner* — Kyoung Lee
(74) *Attorney, Agent, or Firm* — Staas & Halsey LLP

(57) ABSTRACT

A tunnel field-effect transistor and a method for manufacturing a tunnel field-effect transistor is disclosed. Source regions are located on two sides of an oxide structure, an epitaxial layer is located on a surface on a side that is of the source region and that is away from the oxide structure, and a gate structure is located on a surface on a side that is of the epitaxial layer and that is away from the source region, so that a gate electric field direction of the tunnel field-effect transistor is the same as an electron tunneling direction, and carriers on a valence band of the source region tunnel to a conduction band of the epitaxial layer at relatively high tunneling efficiency, thereby generating a steep subthreshold swing and enabling a subthreshold swing value of the tunnel field-effect transistor to be lower than 60 mV/dec to consume relatively low power.

11 Claims, 11 Drawing Sheets

(51) Int. Cl.
  *H01L 21/02* (2006.01)
  *H01L 21/311* (2006.01)
  *H01L 29/786* (2006.01)

(52) U.S. Cl.
  CPC .. *H01L 21/31144* (2013.01); *H01L 29/66742* (2013.01); *H01L 29/78* (2013.01); *H01L 29/78642* (2013.01); *H01L 29/78696* (2013.01)

(58) Field of Classification Search
  CPC ......... H01L 21/31111; H01L 21/02293; H01L 29/66742; H01L 29/78
  See application file for complete search history.

(56) References Cited

U.S. PATENT DOCUMENTS

2014/0353593 A1* 12/2014 Smets ............... H01L 29/66666
  257/39
2015/0318214 A1   11/2015 Tsai et al.

FOREIGN PATENT DOCUMENTS

| CN | 105047703 A | 11/2015 |
| EP | 3 035 374 A1 | 6/2016 |

OTHER PUBLICATIONS

International Search Report dated Aug. 24, 2016, in corresponding International Patent Application No. PCT/CN2015/094590, 11 pgs.
Written Opinion of the International Search Authority dated Aug. 24, 2016, in corresponding International Patent Application No. PCT/CN2015/094590, 3 pgs.

* cited by examiner

TUNNEL FIELD-EFFECT TRANSISTOR AND METHOD FOR MANUFACTURING TUNNEL FIELD-EFFECT TRANSISTOR

CROSS-REFERENCE TO RELATED APPLICATIONS

This application is a continuation of International Application No. PCT/CN2015/094590, filed on Nov. 13, 2015, the disclosure of which is hereby incorporated by reference in its entirety.

TECHNICAL FIELD

The present application relates to the field of semiconductor device technologies, and in particular, to a tunnel field-effect transistor and a method for manufacturing a tunnel field-effect transistor.

BACKGROUND

As a size of a metal-oxide-silicon field effect transistor continuously decreases, especially after a feature size of a device reaches a nanowire scale, negative impact such as a short channel effect of the device is increasingly significant. Because of a limitation imposed by a thermoelectric potential KT/q theory, a subthreshold slope of a conventional MOSFET device cannot synchronously decrease as a size of the device decreases, and a subthreshold leakage current of the conventional MOSFET device continuously increases as a threshold voltage decreases. To overcome increasing challenges of the MOSFET at a nanometer size, a new device structure and a process and a manufacturing method of the new device structure have become a focus of a small-size device.

As a new device structure, a tunnel field-effect transistor (TFET) uses a band-to-band tunneling conduction mechanism, and is an extremely potential low power-consuming device applicable to system integration application and development. When specifically operating, a conventional point-to-point tunneling TFET is a gate-controlled P-I-N structure. That is, bands of a source region and a channel bend under an action of a gate voltage, and there is a band overlapping region. As the gate voltage increases, carriers in the band of the source region tunnel to the band of the channel, form a tunneling current (that is, an on-state current), and flow to a drain end under an action of an electric field. This conduction mechanism breaks through the limitation of the thermoelectric potential KT/q in a theoretical limit of the subthreshold slope of the conventional MOSFET, and theoretically, can implement a super-steep subthreshold slope less than 60 mV/dec at room temperature, so as to reduce a static leakage current of the device and further reduce static power consumption of the device.

However, currently, a subthreshold swing (SS, also referred to as a subthreshold slope) value of an actually used tunnel field-effect transistor still cannot be less than 60 mV/dec, and power consumption is relatively high.

SUMMARY

To resolve the foregoing technical problem, embodiments of the present application provide a tunnel field-effect transistor and a method for manufacturing a tunnel field-effect transistor, a subthreshold swing value of the tunnel field-effect transistor is less than 60 mV/dec, and power consumption is relatively low.

To resolve the foregoing problem, the embodiments of the present application provide the following technical solutions:

According to a first aspect, the present application provides a tunnel field-effect transistor, including:

a substrate;

an oxide structure, where the oxide structure is located on a surface of the substrate;

insulation layers, where the insulation layers are located on the surface of the substrate and two sides of the oxide structure;

source regions, where the source regions are located on surfaces of the insulation layers and the two sides of the oxide structure, and an end face on an end that is of the source region and that is away from the substrate is lower than an end face on a side that is of the oxide structure and that is away from the substrate;

epitaxial layer, where the epitaxial layer is located on the surface of the insulation layer and a surface on a side that is of the source region and that is away from the oxide structure, and an end face on a side that is of the epitaxial layer and that is away from the substrate is flush with an end face on a side that is of the source region and that is away from the substrate;

a gate structure, where the gate structure is located on the surface of the insulation layer and a surface on a side that is of the epitaxial layer and that is away from the source region;

channel layers, where the channel layers are located on the two sides of the oxide structure and cover the source regions and the epitaxial layer, and an end face on a side that is of the channel layer and that is away from the substrate is flush with the end face on the side that is of the oxide structure and that is away from the substrate; and a drain region, where the drain region covers the oxide structure and the channel layers.

In a first possible implementation of the first aspect, in a direction from the source region to the epitaxial layer, a thickness of the source region is 10 nm to 30 nm, and endpoint values are included.

In a second possible implementation of the first aspect, the gate structure includes:

a gate dielectric layer, where the gate dielectric layer is located on the surface of the insulation layer and the surface on the side that is of the epitaxial layer and that is away from the source region; and a gate electrode layer, where the gate electrode layer is located on a surface on a side that is of the gate dielectric layer and that is away from the insulation layer and the epitaxial layer.

In a third possible implementation of the first aspect, the oxide structure is a nanowire structure or a square pillar structure.

According to a second aspect, the present application provides a method for manufacturing a tunnel field-effect transistor, where the method includes:

providing a substrate;

forming an oxide structure on a surface of the substrate;

forming insulation layers in regions that are located on two sides of the oxide structure on the surface of the substrate;

forming source regions and epitaxial layers on surfaces of the insulation layers, where the source regions are located on the two sides of the oxide structure, the epitaxial layer is located on a surface on a side that is of the source region and that is away from the oxide structure, an end face on a side that is of the epitaxial layer and that is away from the substrate is flush with an end face on a side that is of the source region and that is away from the substrate, and both the end face on the side that is of the epitaxial layer and that is away from the substrate and the end face on the side that is of the source region and that is away from the substrate are lower than an end face on a side that is of the oxide structure and that is away from the substrate;

forming, on the side that is of the source region and that is away from the substrate, a channel layer that covers the source region and the epitaxial layer, where the channel layers are located on the two sides of the oxide structure, and an end face on a side that is of the channel layer and that is away from the substrate is flush with the end face on the side that is of the oxide structure and that is away from the substrate;

forming, on the side that is of the oxide structure and that is away from the substrate, a drain region that covers the oxide structure and the channel layers; and forming a gate structure on the surface of the insulation layer, where the gate structure is located on a surface on a side that is of the epitaxial layer and that is away from the source region.

In a first possible implementation of the second aspect, the forming an oxide structure on a surface of the substrate includes:

forming a nitride layer on the surface of the substrate;

forming, on a surface of the nitride layer, a mask layer that has a preset through hole;

etching the nitride layer by using the mask layer as a mask, to form a through hole in the nitride layer, and expose a part of the surface of the substrate, where the through hole is corresponding to a region of the preset through hole in the mask layer;

forming the oxide structure in the through hole; and removing the nitride layer and the mask layer.

With reference to the first possible implementation of the second aspect, in a second possible implementation, a formation process of the oxide structure is a selective epitaxial process.

In a third possible implementation of the second aspect, the forming an oxide structure on a surface of the substrate includes:

forming an oxide layer on the surface of the substrate;

forming, on a surface of the oxide layer, a mask layer that has a preset through hole;

etching the oxide layer by using the mask layer as a mask, and retaining a part of the oxide layer as the oxide structure; and removing the mask layer.

In a fourth possible implementation of the second aspect, the forming source regions and epitaxial layers on surfaces of the insulation layers, where the source regions are located on the two sides of the oxide structure, the epitaxial layer is located on a surface on a side that is of the source region and that is away from the oxide structure, an end face on a side that is of the epitaxial layer and that is away from the substrate is flush with an end face on a side that is of the source region and that is away from the substrate, and both the end face on the side that is of the epitaxial layer and that is away from the substrate and the end face on the side that is of the source region and that is away from the substrate are lower than an end face on a side that is of the oxide structure and that is away from the substrate includes:

forming a first semiconductor layer on an upper surface of the insulation layer, an upper surface of the oxide structure, and surfaces on the two sides of the oxide structure, where the first semiconductor layer is a P-type doped semiconductor layer;

forming a second semiconductor layer on a surface of the first semiconductor layer;

etching the second semiconductor layer and the first semiconductor layer, and removing parts that are of the second semiconductor layer and the first semiconductor layer and that are located on the surface of the insulation layer and the upper surface of the oxide structure;

forming first mask layers on surfaces that are of the insulation layers and that are located on two sides of the second semiconductor layer, where an end face on a side that is of the first mask layer and that is away from the substrate is flush with an end face on a side that is of the second semiconductor layer and that is away from the oxide structure;

etching the first mask layer until the end face on the side that is of the first mask layer and that is away from the substrate is lower than the end face on the side that is of the oxide structure and that is away from the substrate;

forming a second mask layer on a surface of the first mask layer, where the second mask layer covers the first semiconductor layer, the second semiconductor layer, and the first mask layer;

etching the second mask layer, to expose end faces on sides that are of the first semiconductor layer and the second semiconductor layer and that are away from the oxide structure; and etching the second semiconductor layer and the first semiconductor layer until end faces on sides that are of the second semiconductor layer and the first semiconductor layer and that are away from the substrate are lower than an end face on a side of the oxide structure, to form the source region and the epitaxial layer.

In a fifth possible implementation of the second aspect, the forming, on the side that is of the source region and that is away from the substrate, a channel layer that covers the source region and the epitaxial layer, where the channel layers are located on the two sides of the oxide structure, and an end face on a side that is of the channel layer and that is away from the substrate is flush with the end face on the side that is of the oxide structure and that is away from the substrate includes:

forming, by using the second mask layer as a mask, a third semiconductor layer on the side that is of the source region and that is away from the substrate, where the third semiconductor layer covers surfaces on sides that are of the source region, the epitaxial layer, and the oxide structure and that are away from the substrate; and etching the third semiconductor layer by using the second mask layer as a mask until the end face on the side that is of the oxide structure and that is away from the substrate is exposed, to form the channel layer, where an end face on a side that is of the third semiconductor layer and that is away from the substrate is flush with the end face on the side that is of the oxide structure and that is away from the substrate.

In a sixth possible implementation of the second aspect, the forming, on the side that is of the oxide structure and that is away from the substrate, a drain region that covers the oxide structure and the channel layers includes:

forming a fourth semiconductor layer as the drain region on end faces on sides that are of the channel layer and the oxide structure and that are away from the substrate, where an end face on a side that is of the fourth semiconductor layer and that is away from the substrate is flush with an end face on a side that is of the second mask layer and that is away from the substrate.

Compared with the prior art, the foregoing technical solutions have the following advantages:

In the tunnel field-effect transistor provided in the embodiments of the present application, the source regions are located on the two sides of the oxide structure, the epitaxial layer is located on the surface on the side that is of the source region and that is away from the oxide structure, and the gate structure is located on the surface on the side that is of the epitaxial layer and that is away from the source region, so that a gate electric field direction of the tunnel field-effect transistor provided in the embodiments of the present application is the same as an electron tunneling direction, and carriers on a valence band of the source region tunnel to a conduction band of the epitaxial layer at relatively high tunneling efficiency, thereby generating a steep subthreshold swing and enabling a subthreshold swing value of the tunnel field-effect transistor provided in the embodiments of the present application to be lower than 60 mV/dec to consume relatively low power.

In addition, in the tunnel field-effect transistor provided in the embodiments of the present application, the epitaxial layer is totally located between the gate structure and the source region, thereby increasing a tunneling area between the epitaxial layer and the source region, further improving a subthreshold feature of the tunnel field-effect transistor, and reducing the subthreshold swing value of the tunnel field-effect transistor.

In addition, in the tunnel field-effect transistor provided in the embodiments of the present application, the channel layers are located on the two sides of the oxide structure, and the drain region is located on the end face on the side that is of the oxide structure and that is away from the substrate, so that a leakage current is prevented from being generated between the drain region and the channel layer when a voltage is applied on a side that is of the gate structure and that is away from the epitaxial layer, thereby reducing a shutdown current and further reducing power consumption of the tunnel field-effect transistor.

BRIEF DESCRIPTION OF DRAWINGS

To describe the technical solutions in the embodiments of the present application more clearly, the following briefly describes the accompanying drawings required for describing the embodiments. Apparently, the accompanying drawings in the following description show merely some embodiments of the present application, and a person of ordinary skill in the art may still derive other drawings from these accompanying drawings without creative efforts.

DESCRIPTION OF EMBODIMENTS

Figure 1:
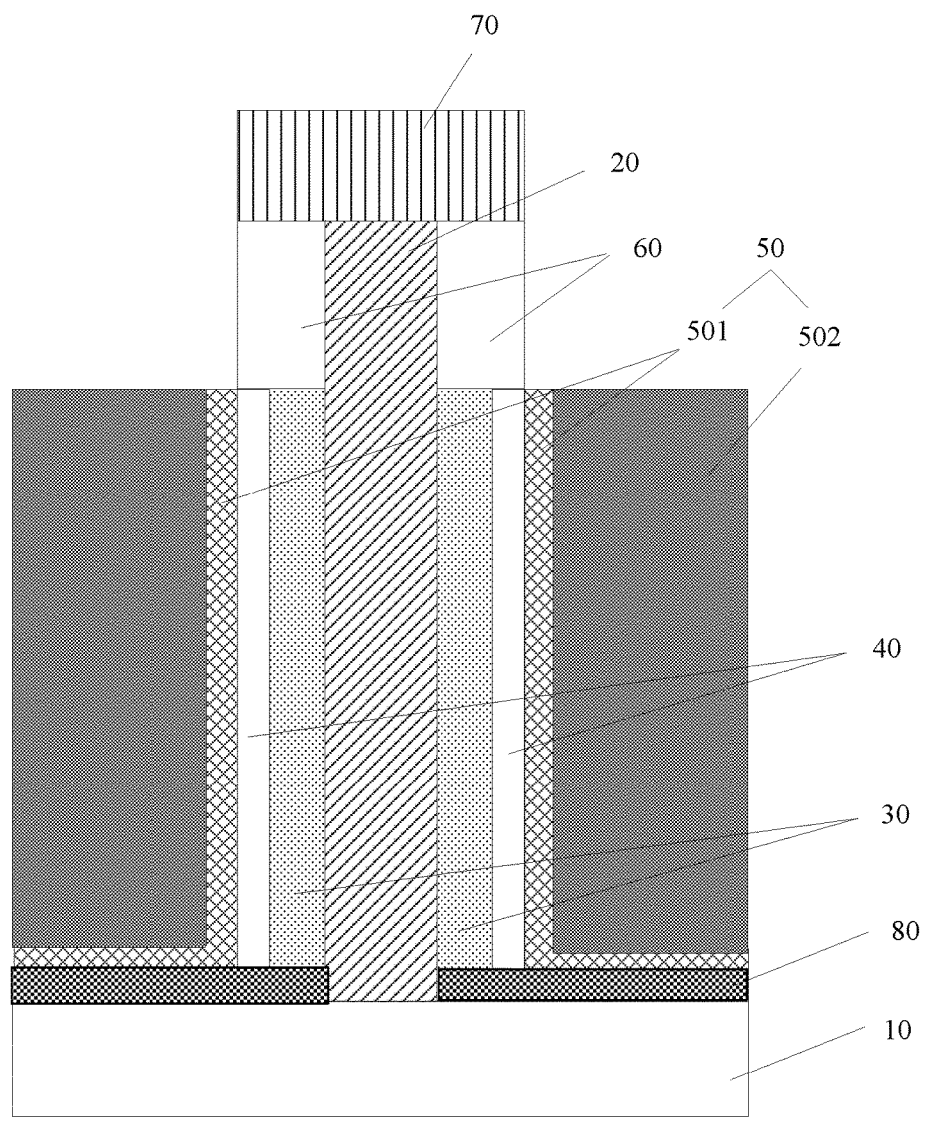
FIG. 1 is a sectional structural diagram of a tunnel field-effect transistor according to an embodiment of the present application.

An embodiment of the present application provides a tunnel field-effect transistor, including:

a substrate;

an oxide structure, where the oxide structure is located on a surface of the substrate;

insulation layers, where the insulation layers are located on the surface of the substrate and two sides of the oxide structure;

source regions, where the source regions are located on surfaces of the insulation layers and the two sides of the oxide structure, and an end face on an end that is of the source region and that is away from the substrate is lower than an end face on a side that is of the oxide structure and that is away from the substrate;

epitaxial layer, where the epitaxial layer is located on the surface of the insulation layer and a surface on a side that is of the source region and that is away from the oxide structure, and an end face on a side that is of the epitaxial layer and that is away from the substrate is flush with an end face on a side that is of the source region and that is away from the substrate;

a gate structure, where the gate structure is located on the surface of the insulation layer and a surface on a side that is of the epitaxial layer and that is away from the source region;

channel layers, where the channel layers are located on the two sides of the oxide structure and cover the source regions and the epitaxial layer, and an end face on a side that is of the channel layer and that is away from the substrate is flush with the end face on the side that is of the oxide structure and that is away from the substrate; and a drain region, where the drain region covers the oxide structure and the channel layers.

Correspondingly, an embodiment of the present application further provides a method for manufacturing a tunnel field-effect transistor, the method is applied to the tunnel field-effect transistor, and the method includes:

providing a substrate;

forming an oxide structure on a surface of the substrate;

forming insulation layers in regions that are located on two sides of the oxide structure on the surface of the substrate;

forming source regions and epitaxial layers on surfaces of the insulation layers, where the source regions are located on the two sides of the oxide structure, the epitaxial layer is located on a surface on a side that is of the source region and that is away from the oxide structure, an end face on a side that is of the epitaxial layer and that is away from the substrate is flush with an end face on a side that is of the source region and that is away from the substrate, and both the end face on the side that is of the epitaxial layer and that is away from the substrate and the end face on the side that is of the source region and that is away from the substrate are lower than an end face on a side that is of the oxide structure and that is away from the substrate;

forming, on the side that is of the source region and that is away from the substrate, a channel layer that covers the source region and the epitaxial layer, where the channel layers are located on the two sides of the oxide structure, and an end face on a side that is of the channel layer and that is away from the substrate is flush with the end face on the side that is of the oxide structure and that is away from the substrate;

forming, on the side that is of the oxide structure and that is away from the substrate, a drain region that covers the oxide structure and the channel layers; and forming a gate structure on the surface of the insulation layer, where the gate structure is located on a surface on a side that is of the epitaxial layer and that is away from the source region.

In the tunnel field-effect transistor and the method for manufacturing a tunnel field-effect transistor that are provided in the embodiments of the present application, the source regions are located on the two sides of the oxide structure, the epitaxial layer is located on the surface on the side that is of the source region and that is away from the oxide structure, and the gate structure is located on the surface on the side that is of the epitaxial layer and that is away from the source region, so that a gate electric field direction of the tunnel field-effect transistor provided in the embodiments of the present application is the same as an electron tunneling direction, and carriers on a valence band of the source region tunnel to a conduction band of the epitaxial layer at relatively high tunneling efficiency, thereby generating a steep subthreshold swing and enabling a subthreshold swing value of the tunnel field-effect transistor provided in the embodiments of the present application to be lower than 60 mV/dec to consume relatively low power.

In addition, in the tunnel field-effect transistor and the method for manufacturing a tunnel field-effect transistor that are provided in the embodiments of the present application, the epitaxial layer is totally located between the gate structure and the source region, thereby increasing a tunneling area between the epitaxial layer and the source region, further improving a subthreshold feature of the tunnel field-effect transistor, and reducing the subthreshold swing value of the tunnel field-effect transistor.

In addition, in the tunnel field-effect transistor and the method for manufacturing a tunnel field-effect transistor that are provided in the embodiments of the present application, the channel layers are located on the two sides of the oxide structure, and the drain region is located on the end face on the side that is of the oxide structure and that is away from the substrate, so that a leakage current is prevented from being generated between the drain region and the channel layer when a voltage is applied on a side that is of the gate structure and that is away from the epitaxial layer, thereby reducing a shutdown current and further reducing power consumption of the tunnel field-effect transistor.

The foregoing is a core idea of this application. The following clearly describes technical solutions in embodiments of the present application with reference to accompanying drawings in the embodiments of the present application. Apparently, the described embodiments are merely some but not all of the embodiments of the present application. All other embodiments obtained by a person of ordinary skill in the art based on the embodiments of the present application without creative efforts shall fall within the protection scope of the present application.

In the following descriptions, many specific details are described to facilitate full understanding of the present application. However, the present application may also be implemented in another manner different from that described herein, and a person skilled in the art may make similar promotion without violating a connotation of the present application. Therefore, the present application is not limited to the specific embodiments disclosed below.

An embodiment of the present application provides a tunnel field-effect transistor. As shown in FIG. 1, the tunnel field-effect transistor includes:

a substrate 10;

an oxide structure 20, where the oxide structure 20 is located on a surface of the substrate 10;

insulation layers 80, where the insulation layers 80 are located on the surface of the substrate 10 and two sides of the oxide structure 20;

source regions 30, where the source regions 30 are located on surfaces of the insulation layers 80 and the two sides of the oxide structure 20, and an end face on an end that is of the source region 30 and that is away from the substrate 10 is lower than an end face on a side that is of the oxide structure 20 and that is away from the substrate 10;

epitaxial layer 40, where the epitaxial layer 40 is located on the surface of the insulation layer 80 and a surface on a side that is of the source region 30 and that is away from the oxide structure 20, and an end face on a side that is of the epitaxial layer 40 and that is away from the substrate 10 is flush with an end face on a side that is of the source region 30 and that is away from the substrate 10;

a gate structure 50, where the gate structure 50 is located on the surface of the insulation layer 80 and a surface on a side that is of the epitaxial layer 40 and that is away from the source region 30, where in an embodiment of the present application, the gate structure 50 includes a gate dielectric layer 501 and a gate electrode layer 502, specific structures of the gate dielectric layer 501 and the gate electrode layer 502 are described in detail in the following and are not described herein; and channel layers 60, where the channel layers 60 are located on the two sides of the oxide structure 20 and cover the source regions 30 and the epitaxial layer 40, and an end face on a side that is of the channel layer 60 and that is away from the substrate 10 is flush with the end face on the side that is of the oxide structure 20 and that is away from the substrate 10; and a drain region 70, where the drain region 70 covers the oxide structure 20 and the channel layers 60.

In this embodiment, the insulation layer 80 is located between the gate structure 50 and the substrate 10, so that the gate structure 50 and the substrate 10 may be isolated from each other, thereby weakening a control action performed on the substrate 10 by the gate structure 50.

Based on the foregoing embodiments, in an embodiment of the present application, a material of the substrate 10 may be silicon, germanium, silicon on insulator (SOI), germanium on insulator (GeOI), an III-V compound material, an II-VI compound material, an IV-IV compound material, or the like. This is not limited in the present application, and is specifically determined according to a situation.

Based on any one of the foregoing embodiments, in an embodiment of the present application, the tunnel field-effect transistor is an N-type tunnel field-effect transistor, the source region 30 is a P-type heavily doped layer, a doping density of the source region 30 may be 1 $e^{18}$ $cm^{-3}$ to 1 $e^{21}$ $cm^{-3}$, and endpoint values are included; and the drain region 70 is an N-type heavily doped layer, and a doping density of the drain region 70 may be 1 $e^{18}$ $cm^{-3}$ to 1 $e^{21}$ $cm^{-3}$. In another embodiment of the present application, the tunnel field-effect transistor is a P-type tunnel field-effect transistor, the source region 30 is an N-type heavily doped layer, a doping density of the source region 30 may be 1 $e^{18}$ $cm^{-3}$ to 1 $e^{21}$ $cm^{-3}$, the drain region 70 is a P-type heavily doped layer, and a doping density of the drain region 70 may be 1 $e^{18}$ $cm^{-3}$ to 1 $e^{21}$ $cm^{-3}$. This is not limited in the present application, and is specifically determined according to a situation.

It should be noted that, in this embodiment of the present application, optionally, the doping density of the drain region 70 is the same as or less than the doping density of the source region 30. This is not limited in the present application, and is specifically determined according to a situation.

It should be further noted that, in this embodiment of the present application, the substrate 10 may be an N-type substrate or a P-type substrate. This is not limited in the present application, and is specifically determined according to a situation.

Based on the foregoing embodiments, in an embodiment of the present application, the substrate 10 is a silicon substrate, and when the substrate 10 is P-type doped, a P-type doped particle of the substrate 10 may be: B, Al, Ga, In, Ti, Pd, Na, Be, Zn, Au, Co, V, Ni, MO, Hg, Sr, Ge, W, Pb, 0, or F; or when the substrate 10 is N-type doped, an N-type doped particle of the substrate 10 may be: Li, Sb, P, As, Bi, Te, Ti, C, Mg, Se, Cr, Ta, Cs, Ba, S, Mn, Ag, Cd, or Pt.

In another embodiment of the present application, the substrate 10 is a germanium substrate, and when the substrate 10 is P-type doped, a P-type doped particle of the substrate 10 may be: B, Al, In, Ga, Be, Zn, Cr, Cd, Hg, Co, Ni, Mn, Fe, or Pt; or when the substrate 10 is N-type doped, an N-type doped particle of the substrate 10 may be: Li, Sb, P, As, S, Se, Te, Cu, Au, or Ag.

Based on any one of the foregoing embodiments, in an optional embodiment of the present application, in a direction from the source region 30 to the epitaxial layer 40, a thickness of the source region 30 is 10 nm to 30 nm, and endpoint values are included. Further, optionally, the thickness of the source region 30 is approximately 20 nm, and an ultra thin source region 30 is implemented, so that a p-n junction formed by the source region 30 and the epitaxial layer 40 is totally depleted, and a carrier tunneling probability is increased, thereby further improving a subthreshold feature of the tunnel field-effect transistor and reducing a subthreshold swing value.

Based on any one of the foregoing embodiments, in a specific embodiment of the present application, the gate structure 50 includes:

a gate dielectric layer 501, where the gate dielectric layer 501 is located on the surface of the insulation layer 80 and the surface on the side that is of the epitaxial layer 40 and that is away from the source region 30; and a gate electrode layer 502, where the gate electrode layer 502 is located on a surface on a side that is of the gate dielectric layer 501 and that is away from the insulation layer 80 and the epitaxial layer 40.

It should be noted that, in an optional embodiment of the present application, a material of the gate electrode layer 502 may be polycrystalline silicon, metal, or a metal stack material; and a material of the gate dielectric layer 501 may be silica, a high-K dielectric material (for example, $HfO_2$), a stack material of silica and high-K dielectric, or the like. This is not limited in the present application, and is specifically determined according to a situation.

In this embodiment of the present application, the channel layers 60 are located on the two sides of the oxide structure 20, and the drain region 70 is located on the end face on the side that is of the oxide structure 20 and that is away from the substrate 10, so that a leakage current is prevented from being generated between the drain region 70 and the channel layer 60 when a voltage is applied on a side that is of the gate structure 50 and that is away from the epitaxial layer 40, thereby reducing a shutdown current and further reducing power consumption of the tunnel field-effect transistor.

Based on the foregoing embodiments, in an embodiment of the present application, the oxide structure 20 is a pillar structure. In a specific embodiment of the present application, the oxide structure 20 is a square pillar structure; and in another specific embodiment of the present application, the oxide structure 20 is a nanowire structure, that is, the oxide structure 20 is a columnar structure, and accordingly, a region surrounding the oxide structure 20 is also cylindrical. Because the nanowire structure is well known to a person skilled in the art, the nanowire structure is not described in detail in the present application.

Figure 2:
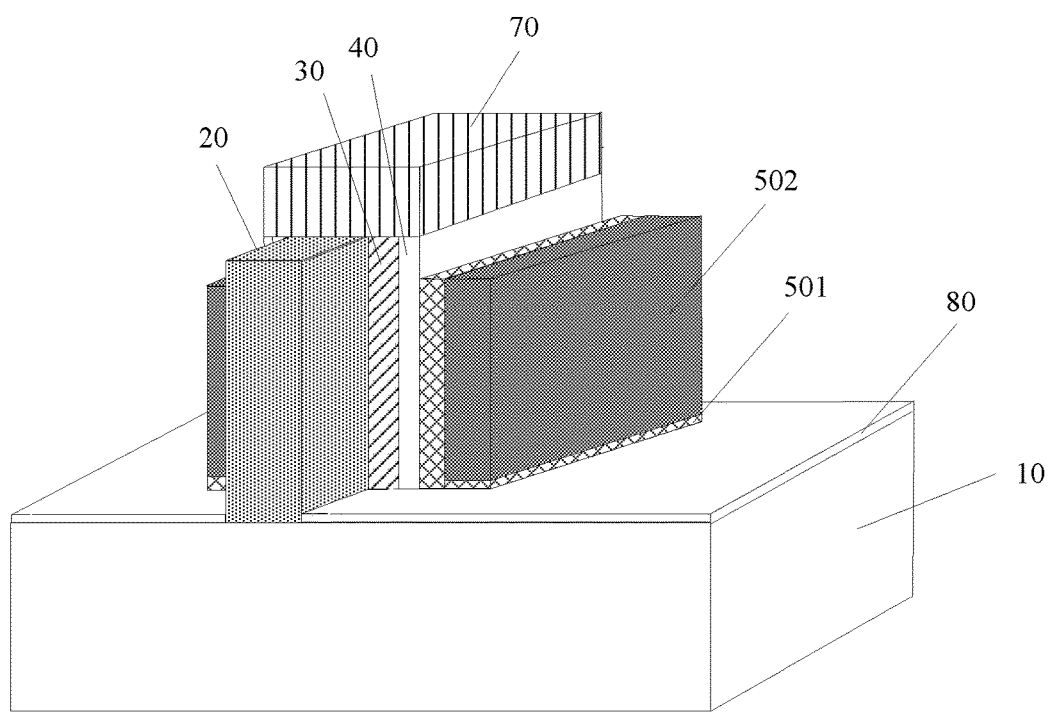
FIG. 2 is a structural stereogram of a tunnel field-effect transistor according to another embodiment of the present application.

It should be noted that, when the oxide structure 20 is the square pillar structure, the source region 30 may totally cover surfaces on the two sides of the oxide structure 20, or may partially cover the surfaces on the two sides of the oxide structure 20 (as shown in FIG. 2), so that a structural shape of the tunnel field-effect transistor is similar to a fin shape. This is not limited in the present application, and is specifically determined according to a situation.

Based on any one of the foregoing embodiments, in an embodiment of the present application, a material of the oxide structure 20 may be silica or another oxide. This is not limited in the present application, and the material of the oxide structure 20 is only needed to be an insulation oxide.

In addition, the tunnel field-effect transistor provided in this embodiment of the present application further includes: a gate electrode (not shown in the figure) electrically connected to the gate electrode layer 502, a source region electrode (not shown in the figure) electrically connected to the source region 30, and a drain region electrode (not shown in the figure) electrically connected to the drain region 70.

In the tunnel field-effect transistor provided in this embodiment of the present application, the source regions 30 are located on the two sides of the oxide structure 20, the epitaxial layer 40 is located on the surface on the side that is of the source region 30 and that is away from the oxide structure 20, and the gate structure 50 is located on the surface on the side that is of the epitaxial layer 40 and that is away from the source region 30, so that a gate electric field direction of the tunnel field-effect transistor provided in this embodiment of the present application is the same as an electron tunneling direction, and carriers on a valence band of the source region 30 tunnel to a conduction band of the epitaxial layer 40 at relatively high tunneling efficiency, thereby generating a steep subthreshold swing and enabling a subthreshold swing value of the tunnel field-effect transistor provided in this embodiment of the present application to be lower than 60 mV/dec to consume relatively low power.

In addition, in the tunnel field-effect transistor provided in this embodiment of the present application, the epitaxial layer 40 is totally located between the gate structure 50 and the source region 30, thereby increasing a tunneling area between the epitaxial layer 40 and the source region 30, further improving a subthreshold feature of the tunnel field-effect transistor, and reducing the subthreshold swing value of the tunnel field-effect transistor.

Figure 3:
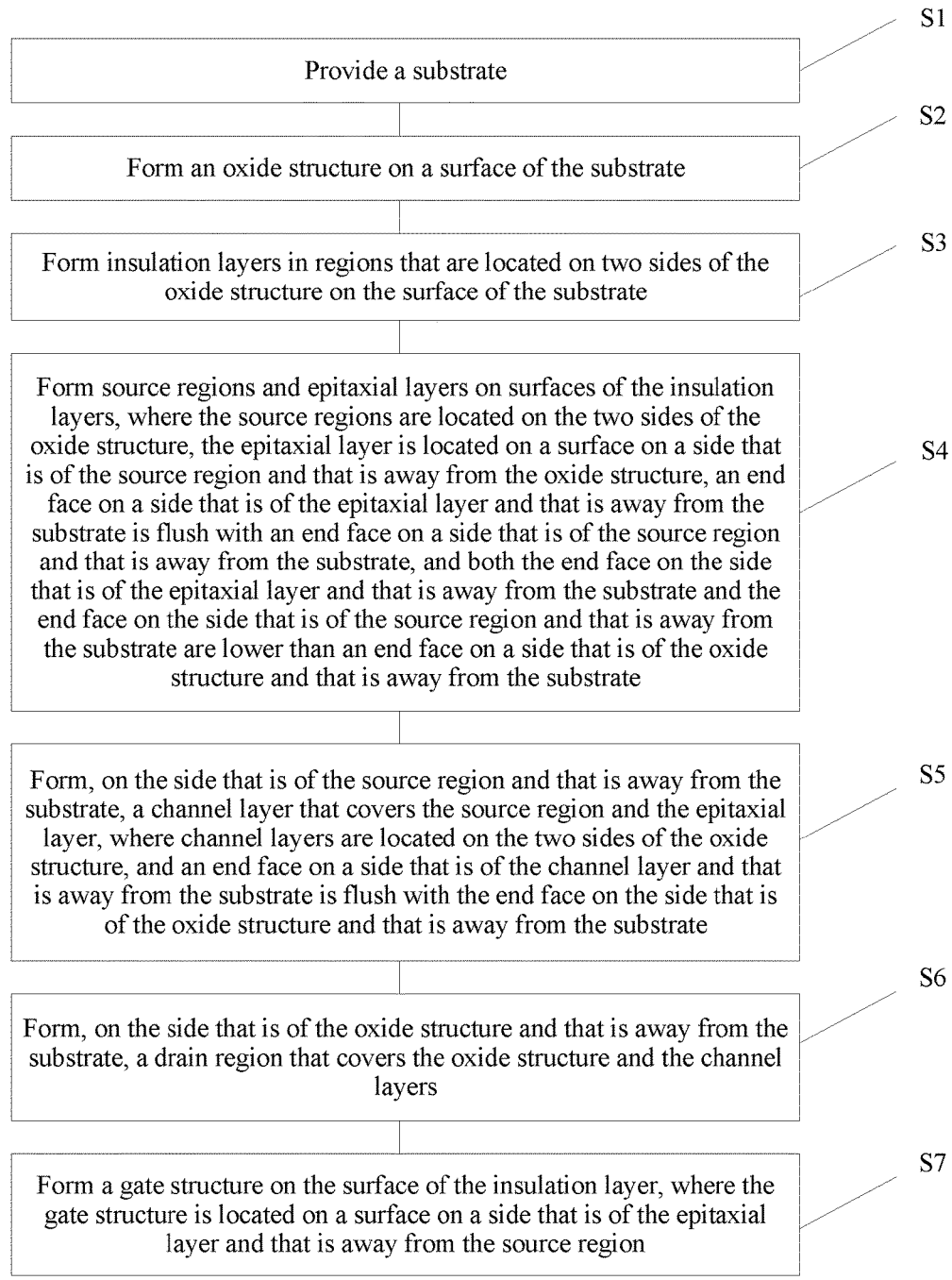
FIG. 3 is a flowchart of a method for manufacturing a tunnel field-effect transistor according to an embodiment of the present application.

Correspondingly, an embodiment of the present application further provides a method for manufacturing a tunnel field-effect transistor, and the method is applied to the tunnel field-effect transistor provided in any one of the foregoing embodiments. As shown in FIG. 3, the method includes the following steps.

Step S1: Manufacture a substrate 10. In this embodiment of the present application, a material of the substrate 10 may be silicon, germanium, silicon on insulator, germanium on insulator, an III-V compound material, an II-VI compound material, an IV-IV compound material, or the like. This is not limited in the present application, and is specifically determined according to a situation.

Based on the foregoing embodiments, in an embodiment of the present application, the substrate 10 is a silicon substrate, and when the substrate 10 is P-type doped, a P-type doped particle of the substrate 10 may be: B, Al, Ga, In, Ti, Pd, Na, Be, Zn, Au, Co, V, Ni, MO, Hg, Sr, Ge, W, Pb, O, or F; or when the substrate 10 is N-type doped, an N-type doped particle of the substrate 10 may be: Li, Sb, P, As, Bi, Te, Ti, C, Mg, Se, Cr, Ta, Cs, Ba, S, Mn, Ag, Cd, or Pt.

In another embodiment of the present application, the substrate 10 is a germanium substrate, and when the substrate 10 is P-type doped, a P-type doped particle of the substrate 10 may be: B, Al, In, Ga, Be, Zn, Cr, Cd, Hg, Co, Ni, Mn, Fe, or Pt; or when the substrate 10 is N-type doped, an N-type doped particle of the substrate 10 may be: Li, Sb, P, As, S, Se, Te, Cu, Au, or Ag.

Step S2: Form an oxide structure 20 on a surface of the substrate 10. In this embodiment of the present application, a material of the oxide structure 20 may be silica or another oxide. This is not limited in the present application, and the material of the oxide structure 20 is only needed to be an insulation oxide.

In an embodiment of the present application, forming the oxide structure 20 on the surface of the substrate 10 includes the following steps.

Figure 4:
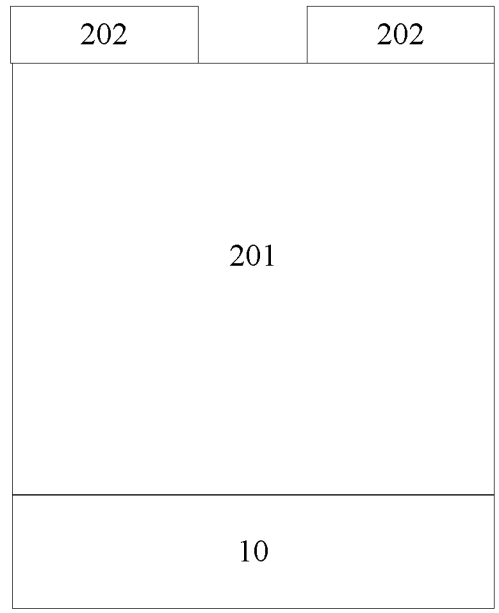
FIG. 4 to FIG. 18 are schematic structural diagrams corresponding to steps in a method for manufacturing a tunnel field-effect transistor according to an embodiment of the present application.

Step S201: As shown in FIG. 4, form a nitride layer 201 on the surface of the substrate 10. In this embodiment of the present application, a formation process of the nitride layer 201 may be a chemical vapor deposition process or another process. This is not limited in the present application, and is specifically determined according to a situation.

Step S202: Form, on a surface of the nitride layer 201, a mask layer 202 that has a preset through hole. In an embodiment of the present application, forming, on the surface of the nitride layer 201, the mask layer 202 that has the preset through hole includes:

forming a complete mask layer on the surface of the nitride layer 201, where the complete mask layer totally covers the nitride layer 201;

forming a photoresist layer on a surface of the complete mask layer;

placing a mask plate on a surface of the photoresist layer, where the mask plate has a window at a position corresponding to a to-be-formed preset through hole in the complete mask layer;

exposing and developing the photoresist layer by using the mask plate as a mask, to form a patterned photoresist figure;

etching the complete mask layer by using the patterned photoresist figure as a mask, to form the mask layer 202 that has the preset through hole; and removing the patterned photoresist figure.

Figure 5:
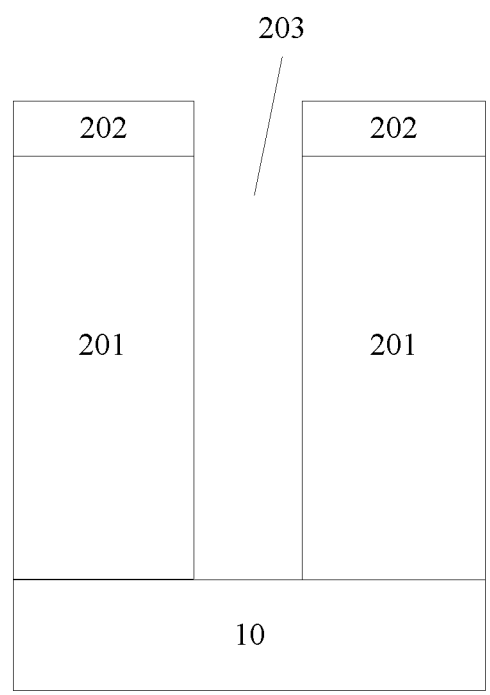

Step S203: As shown in FIG. 5, etch the nitride layer 201 by using the mask layer 202 as a mask, to form a through hole 203 in the nitride layer 201, and expose a part of the surface of the substrate 10, where the through hole 203 is corresponding to a region of the preset through hole in the mask layer.

It should be noted that, in this embodiment of the present application, a material of the mask layer 202 is different from that of the nitride layer 201, and therefore, an etching ratio may be selected, so that etching rates for the mask layer 202 and the nitride layer 201 are different, thereby implementing selective etching on the nitride layer 201 by using the mask layer 202 as the mask.

Step S204: Form the oxide structure 20 in the through hole 203. In an embodiment of the present application, forming the oxide structure 20 in the through hole 203 includes: depositing the oxide structure 20 in the through hole 203 of the nitride layer 201. Optionally, a formation process of the oxide structure 20 is a selective epitaxial process. However, this is not limited in the present application, and is specifically determined according to a situation.

Figure 6:
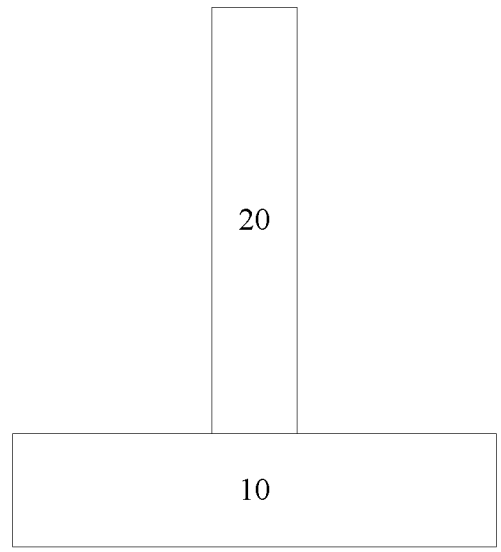

Step S205: As shown in FIG. 6, remove the nitride layer 201 and the mask layer 202, and retain only the oxide structure 20.

It should be noted that, in this embodiment of the present application, the nitride layer 201 is first etched to form the through hole 203 in the nitride layer 201, and the oxide structure 20 is then deposited in the through hole 203. This may reduce roughness of side faces on two sides of the oxide structure 20 and improve device performance of the tunnel field-effect transistor.

It should be further noted that, in this embodiment of the present application, the material of the nitride layer 201 may alternatively be replaced with oxynitride or the like. This is not limited in the present application, and it only needs to be ensured that an etching ratio of the nitride layer 201 is different from that of the oxide structure 20, so that the nitride layer 201 may be removed by selecting an appropriate etching ratio, and no damage or relatively small damage is caused to the oxide structure 20.

In another embodiment of the present application, forming the oxide structure 20 on the surface of the substrate 10 includes the following steps.

Step S211: Form an oxidation layer on the surface of the substrate 10. In this embodiment of the present application, a formation process of the oxidation layer may be a chemical vapor deposition process, an oxidation process, or another process. This is not limited in the present application, and is specifically determined according to a situation.

Step S212: Form, on a surface of the oxidation layer, a mask layer that has a preset through hole. In an embodiment of the present application, forming, on the surface of the oxidation layer, the mask layer that has the preset through hole includes:

forming a complete mask layer on the surface of the oxidation layer, where the complete mask layer totally covers the oxidation layer;

forming a photoresist layer on a surface of the complete mask layer;

placing a mask plate on a surface of the photoresist layer, where the mask plate has a window at a position corresponding to a to-be-formed preset through hole in the complete mask layer;

exposing and developing the photoresist layer by using the mask plate as a mask, to form a patterned photoresist figure;

etching the complete mask layer by using the patterned photoresist figure as a mask, to form the mask layer that has the preset through hole; and removing the photoresist figure.

Step S213: Etch the oxidation layer by using the mask layer as a mask, and retain a part of the oxidation layer as the oxide structure 20.

Step S214: Remove the mask layer.

It should be noted that, in this embodiment of the present application, a material of the mask layer is different from that of the oxidation layer, so that an etching ratio is selected to perform selective etching on the oxidation layer by using the mask layer as the mask.

It should be further noted that, in this embodiment of the present application, the oxide structure is formed by directly etching the oxidation layer, and a deposition process may be reduced, so as to reduce process steps of the tunnel field-effect transistor and improve production efficiency of the tunnel field-effect transistor.

Based on the foregoing embodiments, in an embodiment of the present application, the oxide structure 20 is a pillar structure. In a specific embodiment of the present application, the oxide structure 20 is a square pillar structure; and in another specific embodiment of the present application, the oxide structure 20 is a nanowire structure, that is, the oxide structure 20 is a columnar structure, and accordingly, a region surrounding the oxide structure 20 is also cylindrical. Because the nanowire structure is well known to a person skilled in the art, the nanowire structure is not described in detail in the present application.

It should be noted that, when the oxide structure 20 is the square pillar structure, the source region 30 may totally cover surfaces on the two sides of the oxide structure 20, or may partially cover the surfaces on the two sides of the oxide structure 20 (as shown in FIG. 2), so that a structural shape of the tunnel field-effect transistor is similar to a fin shape. This is not limited in the present application, and is specifically determined according to a situation.

Based on any one of the foregoing embodiments, in an embodiment of the present application, a material of the oxide structure 20 may be silica or another oxide. This is not limited in the present application, and the material of the oxide structure 20 is only needed to be an insulation oxide.

Figure 7:
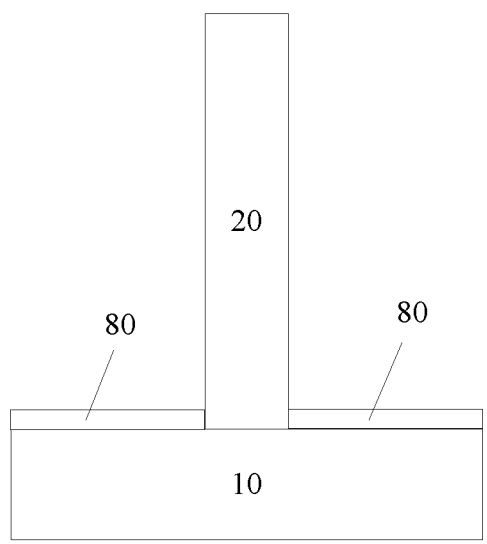

Step S3: As shown in FIG. 7, form insulation layers 80 in regions that are located on two sides of the oxide structure 20 on the surface of the substrate 10.

Specifically, in an embodiment of the present application, forming the insulation layers 80 in the regions that are located on the two sides of the oxide structure 20 on the surface of the substrate 10 includes: forming an entire insulation layer on surfaces of the substrate 10 and the oxide structure 20, where the entire insulation layer covers the substrate 10 and the oxide structure 20; and etching the entire insulation layer, and retaining only a part located on the surface of the substrate, to form the insulation layers 80.

It should be noted that, in this embodiment of the present application, a formation process of the insulation layer 80 may be a sidewall transfer process, a photoresist process, a double patterning process, or the like. This is not limited in the present application.

Step S4: Form source regions 30 and epitaxial layers 40 on surfaces of the insulation layers 80, where the source regions 30 are located on the two sides of the oxide structure 20, the epitaxial layer 40 is located on a surface on a side that is of the source region 30 and that is away from the oxide structure 20, an end face on a side that is of the epitaxial layer 40 and that is away from the substrate 10 is flush with an end face on a side that is of the source region 30 and that is away from the substrate 10, and both the end face on the side that is of the epitaxial layer 40 and that is away from the substrate 10 and the end face on the side that is of the source region 30 and that is away from the substrate 10 are lower than an end face on a side that is of the oxide structure 20 and that is away from the substrate 10.

The following uses a case in which the substrate 10 is a P-type substrate, the source region 30 is a P-type doped layer, and the drain region 70 is an N-type doped layer as an example to describe the method for manufacturing a tunnel field-effect transistor that is provided in this embodiment of the present application. However, this is not limited in the present application, and is specifically determined according to a situation.

In an embodiment of the present application, forming the source regions 30 and the epitaxial layers 40 on the surfaces of the insulation layers 80, where the source regions 30 are located on the two sides of the oxide structure 20, the epitaxial layer 40 is located on the surface on the side that is of the source region 30 and that is away from the oxide structure 20, the end face on the side that is of the epitaxial layer 40 and that is away from the substrate 10 is flush with the end face on the side that is of the source region 30 and that is away from the substrate 10, and both the end face on the side that is of the epitaxial layer 40 and that is away from the substrate 10 and the end face on the side that is of the source region 30 and that is away from the substrate 10 are lower than the end face on the side that is of the oxide structure 20 and that is away from the substrate 10 includes the following steps.

Figure 8:
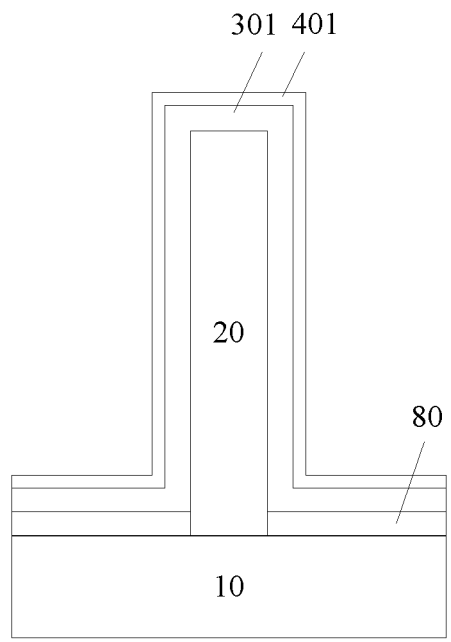

Step S401: As shown in FIG. 8, form a first semiconductor layer 301 on an upper surface of the insulation layer 80, an upper surface of the oxide structure 20, and surfaces on the two sides of the oxide structure 20. The first semiconductor layer 301 is a P-type doped semiconductor layer.

In an optional embodiment of the present application, the substrate 10 is a P-type semiconductor substrate, and the first semiconductor layer 301 is a P-type heavily doped semiconductor layer. Further, optionally, a doping density of the first semiconductor layer 301 is 1 $e^{18}$ cm$^{-3}$ to 1 $e^{21}$ cm$^{-3}$, and endpoint values are included. However, this is not limited in the present application, and is specifically determined according to a situation.

Step S402: As shown in FIG. 8, form a second semiconductor layer 401 on a surface of the first semiconductor layer 301. In this embodiment of the present application, the second semiconductor layer 401 may be an intrinsic semiconductor layer (that is, a non-doped semiconductor layer), a lightly doped semiconductor layer, or a heavily doped semiconductor layer.

It should be noted that, in this embodiment of the present application, a formation process of the first semiconductor layer 301 and the second semiconductor layer 401 may be a chemical vapor deposition process. However, this is not limited in the present application, and is specifically determined according to a situation.

It should be further noted that, in this embodiment of the present application, the formation process of the first semiconductor layer 301 and the second semiconductor layer 401 may be in-situ doping. In another embodiment of the present application, doping may be performed by means of subsequent ion injection. However, this is not limited in the present application, and is specifically determined according to a situation.

Figure 9:
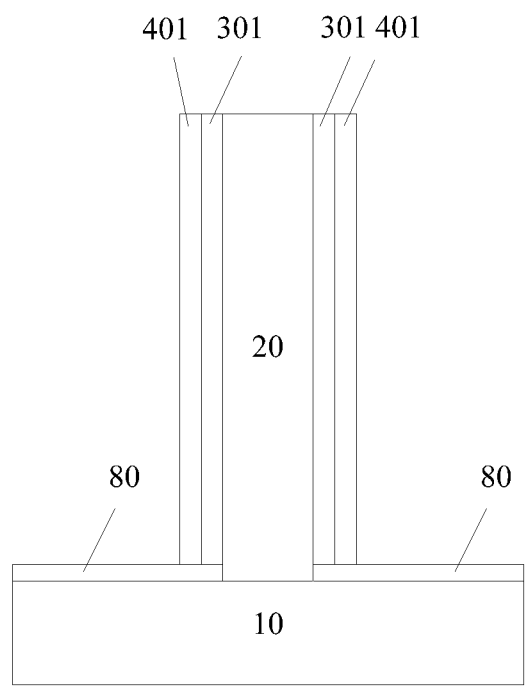

Step S403: As shown in FIG. 9, etch the second semiconductor layer 401 and the first semiconductor layer 301, and remove parts that are of the second semiconductor layer 401 and the first semiconductor layer 301 and that are located on the surface of the insulation layer 80 and the upper surface of the oxide structure 20 (that is, a part on the end face on the side that is of the oxide structure 20 and that is away from the substrate 10).

Figure 10:
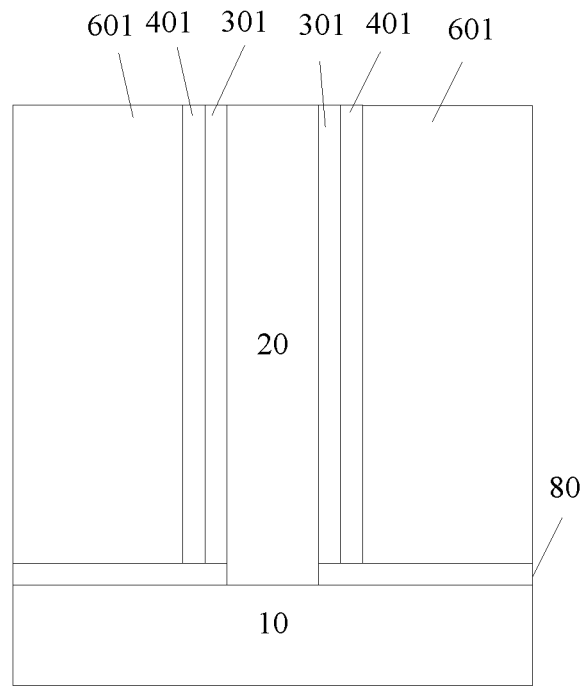

Step S404: As shown in FIG. 10, form first mask layers 601 on surfaces that are of the insulation layers 80 and that are located on two sides of the second semiconductor layer 401, where an end face on a side that is of the first mask layer 601 and that is away from the substrate 10 is flush with an end face on a side that is of the second semiconductor layer 401 and that is away from the oxide structure 20.

Figure 11:
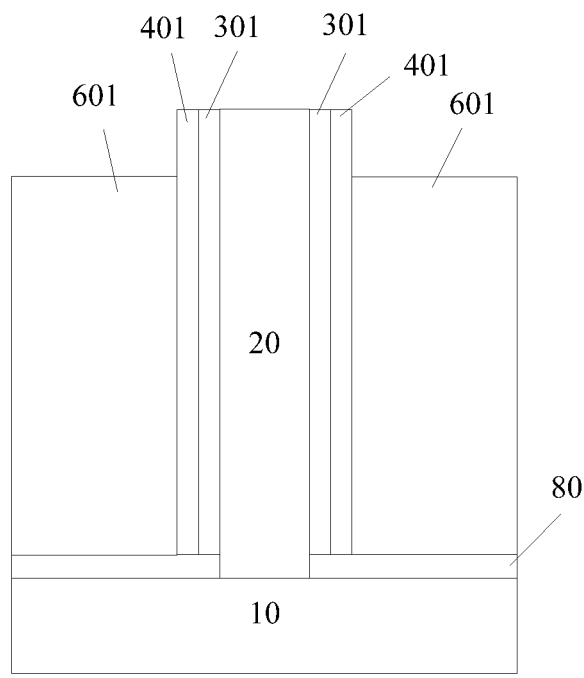

Step S405: As shown in FIG. 11, etch the first mask layer 601 until the end face on the side that is of the first mask layer 601 and that is away from the substrate 10 is lower than the end face on the side that is of the oxide structure 20 and that is away from the substrate 10.

Figure 12:
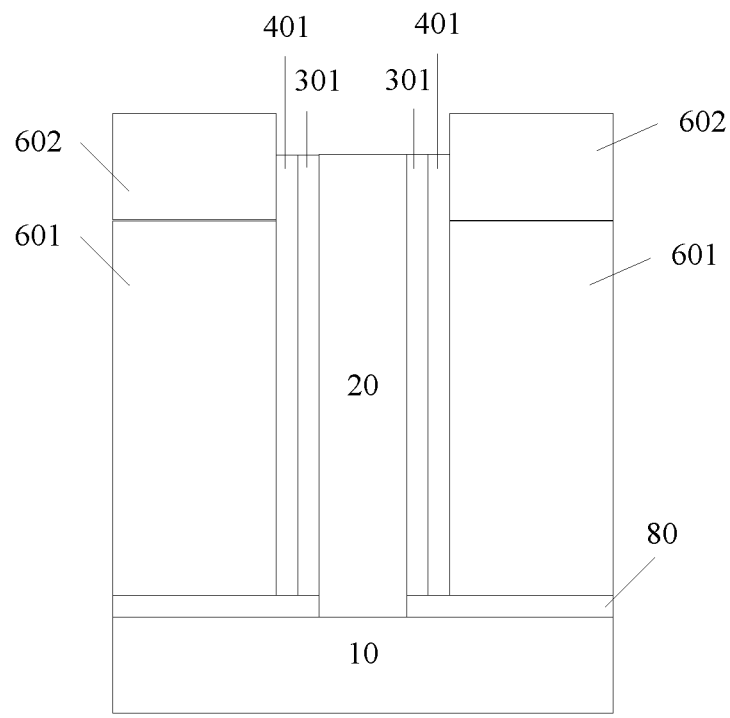

Step S406: As shown in FIG. 12, form a second mask layer 602 on a surface of the first mask layer 601, where the second mask layer 602 covers the first semiconductor layer 301, the second semiconductor layer 401, and the first mask layer 601.

Step S407: Etch the second mask layer 602, to expose end faces on sides that are of the first semiconductor layer 301 and the second semiconductor layer 401 and that are away from the oxide structure 20.

Figure 13:
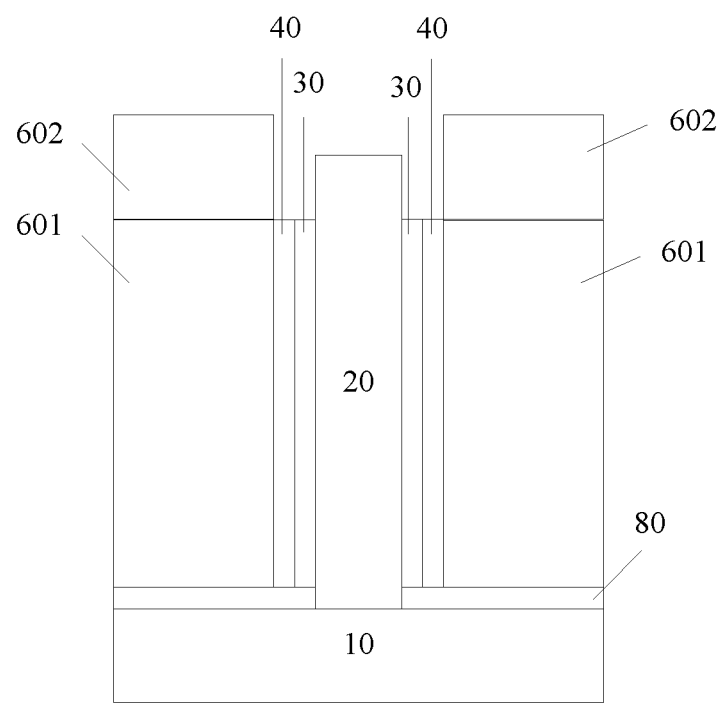

Step S408: As shown in FIG. 13, etch the second semiconductor layer 401 and the first semiconductor layer 301 until end faces on sides that are of the second semiconductor layer 401 and the first semiconductor layer 301 and that are away from the substrate 10 are lower than an end face on a side of the oxide structure 20, to form the source region 30 and the epitaxial layer 40.

Based on any one of the foregoing embodiments, in an optional embodiment of the present application, in a direction from the source region 30 to the epitaxial layer 40, a thickness of the source region 30 is 10 nm to 30 nm, and endpoint values are included. Further, optionally, the thickness of the source region 30 is approximately 20 nm, and an ultra thin source region 30 is implemented, so that a p-n junction formed by the source region 30 and the epitaxial layer 40 is totally depleted, and a carrier tunneling probability is increased, thereby further improving a subthreshold feature of the tunnel field-effect transistor and reducing a subthreshold swing value.

Step S5: Form, on the side that is of the source region 30 and that is away from the substrate 10, a channel layer 60 that covers the source region 30 and the epitaxial layer 40, where channel layers 60 are located on the two sides of the oxide structure 20, and an end face on a side that is of the channel layer 60 and that is away from the substrate 10 is flush with the end face on the side that is of the oxide structure 20 and that is away from the substrate 10.

Figure 14:
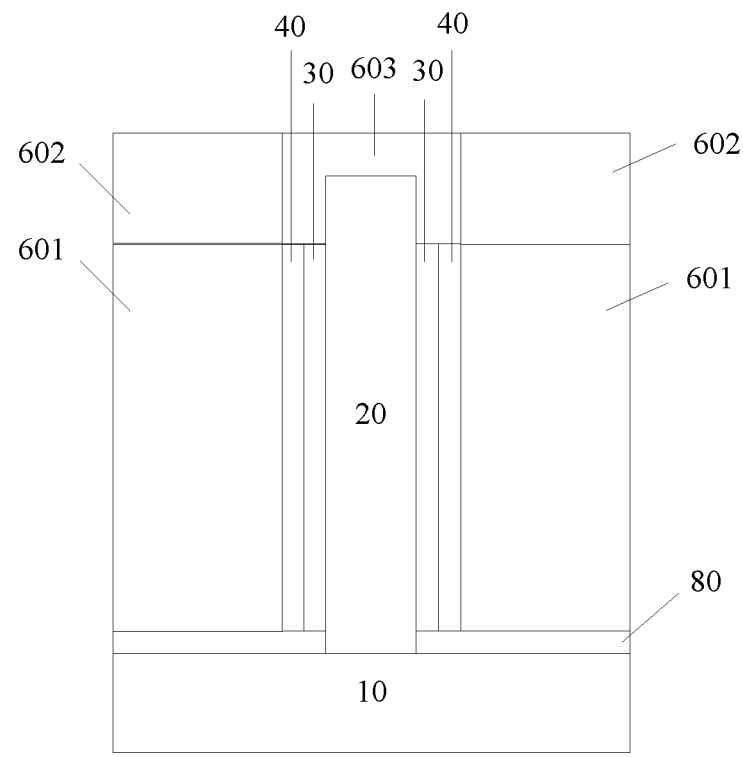
Figure 15:
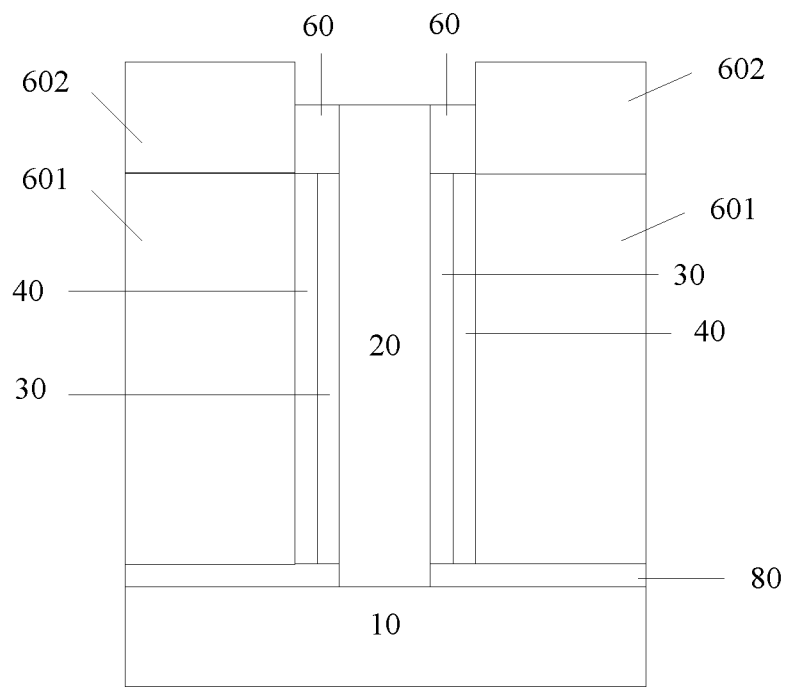

In an optional embodiment of the present application, forming, on the side that is of the source region 30 and that is away from the substrate 10, the channel layer 60 that covers the source region 30 and the epitaxial layer 40, where the channel layers 60 are located on the two sides of the oxide structure 20, and the end face on the side that is of the channel layer 60 and that is away from the substrate 10 is flush with the end face on the side that is of the oxide structure 20 and that is away from the substrate 10 includes:

as shown in FIG. 14, forming, by using the second mask layer 602 as a mask, a third semiconductor layer 603 on the side that is of the source region 30 and that is away from the substrate 10, where the third semiconductor layer 603 covers surfaces on sides that are of the source region 30, the epitaxial layer 40, and the oxide structure 20 and that are away from the substrate 10; and as shown in FIG. 15, etching the third semiconductor layer 603 by using the second mask layer 602 as a mask until the end face on the side that is of the oxide structure 20 and that is away from the substrate 10 is exposed, to form the channel layer 60, where an end face on a side that is of the third semiconductor layer 603 and that is away from the substrate 10 is flush with the end face on the side that is of the oxide structure 20 and that is away from the substrate 10.

It should be noted that, in this embodiment of the present application, the third semiconductor layer 603 may be an intrinsic semiconductor layer (that is, a non-doped semiconductor layer) or a lightly doped semiconductor layer. This is not limited in the present application, and is specifically determined according to a situation.

Step S6: Form, on the side that is of the oxide structure 20 and that is away from the substrate 10, a drain region 70 that covers the oxide structure 20 and the channel layers 60.

Figure 16:
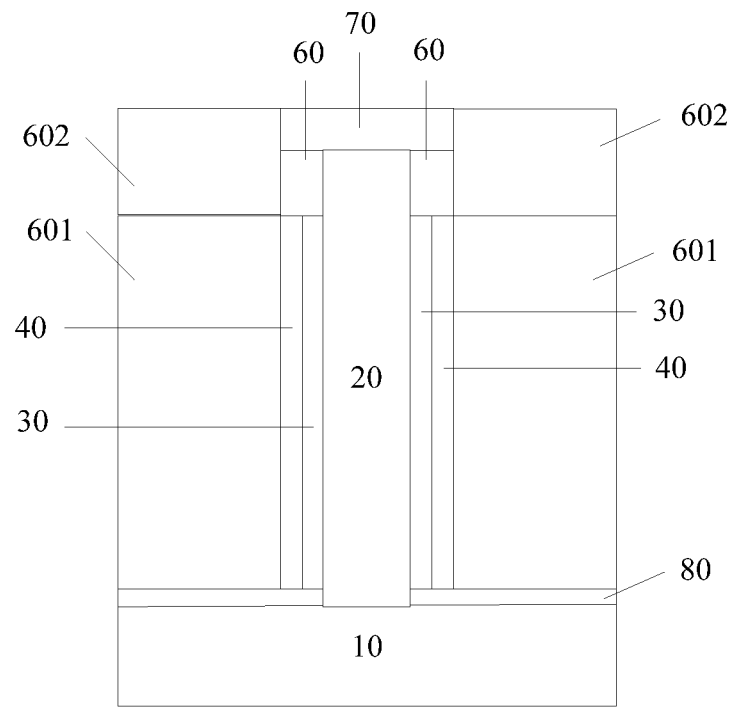
Figure 17:
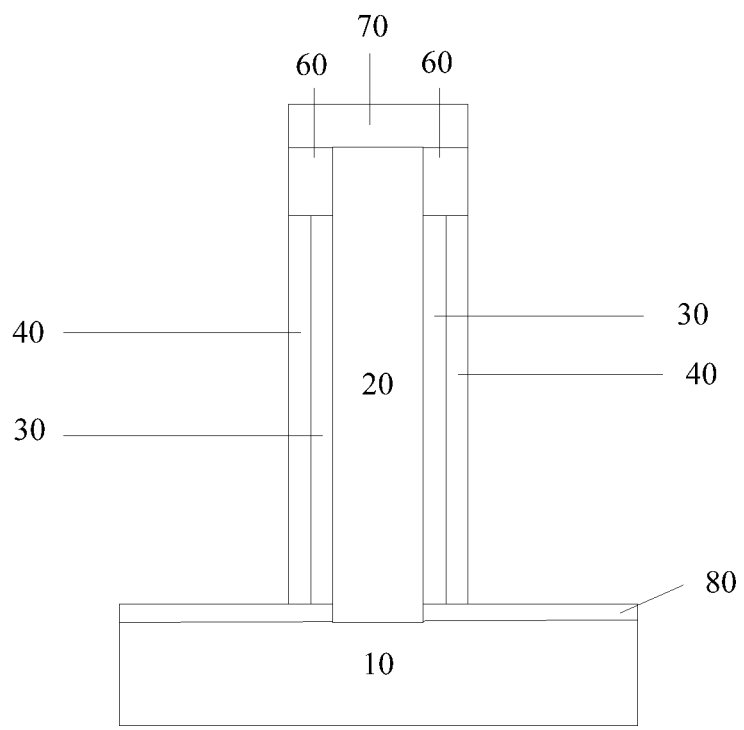

In an embodiment of the present application, forming, on the side that is of the oxide structure 20 and that is away from the substrate 10, the drain region 70 that covers the oxide structure 20 and the channel layers 60 includes:

as shown in FIG. 16, forming, by using the second mask layer 602 as the mask continuously, a fourth semiconductor layer 70 as the drain region 70 on end faces on sides that are of the channel layer 60 and the oxide structure 20 and that are away from the substrate 10, where an end face on a side that is of the fourth semiconductor layer 70 and that is away from the substrate 10 is flush with an end face on a side that is of the second mask layer 602 and that is away from the substrate 10; and as shown in FIG. 17, removing the second mask layer 602 and the first mask layer 601.

In an embodiment of the present application, the fourth semiconductor layer 70 may be an N-type heavily doped semiconductor layer; and in another embodiment of the present application, the fourth semiconductor layer 70 may be a P-type heavily doped semiconductor layer. This is not limited in the present application, and it only needs to be ensured that doping types of the drain region 70 and the source region 30 are opposite and are heavy doping. Optionally, a doping density of the drain region 70 is $1\ e^{18}\ cm^{-3}$ to $1\ e^{21}\ cm^{-3}$.

Figure 18:
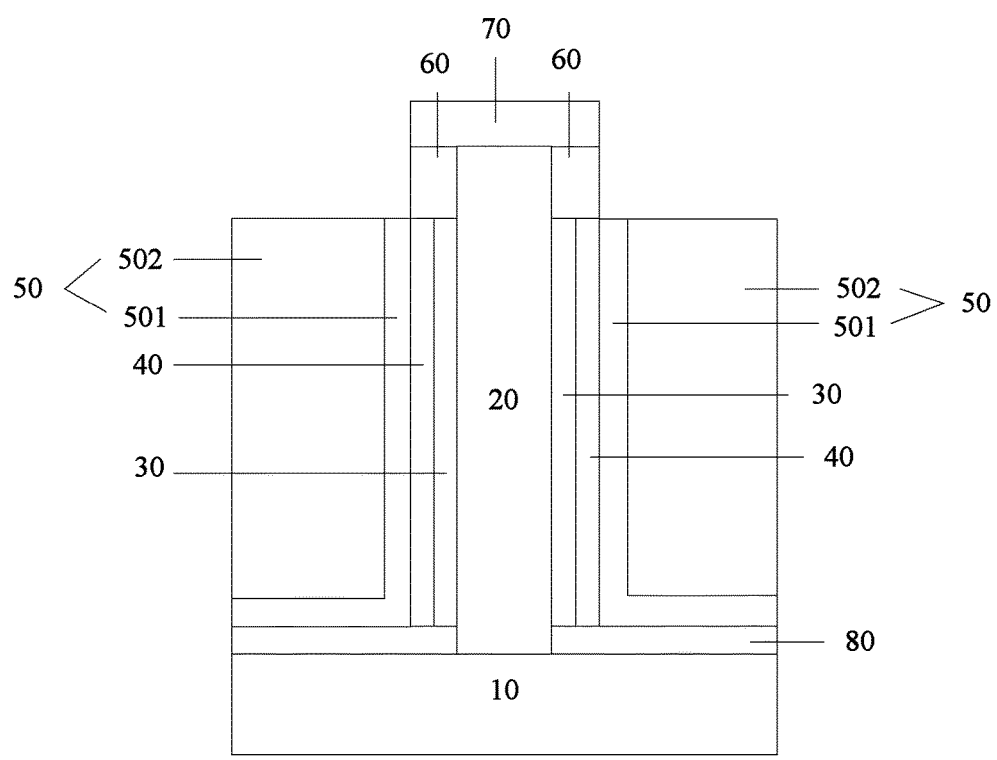

Step S7: As shown in FIG. 18, form a gate structure 50 on the surface of the insulation layer 80, where the gate structure 50 is located on a surface on a side that is of the epitaxial layer 40 and that is away from the source region 30, and an end face on a side that is of the gate structure 50 and that is away from the substrate 10 is flush with the end face on the side that is of the epitaxial layer 40 and that is away from the substrate 10.

In an embodiment of the present application, forming the gate structure 50 on the surface of the insulation layer 80, where the gate structure 50 is located on the surface on the side that is of the epitaxial layer 40 and that is away from the source region 30 includes:

forming gate dielectric layers 501 on surfaces that are of the insulation layer 80 and that are located on two sides of the epitaxial layer 40 and a surface on a side that is of the epitaxial layer 40 and that is away from the source region 30, where the gate dielectric layer 501 is an L-type structure;

forming a gate electrode layer 502 on a surface of the gate dielectric layer 501; and etching the gate dielectric layer 501 and the gate electrode layer 502, so that end faces on sides that are of the gate dielectric layer 501 and the gate electrode layer 502 and that are away from the substrate 10 are flush with the end face on the side that is of the epitaxial layer 40 and that is away from the substrate 10.

Based on the foregoing embodiment, in an embodiment of the present application, the method for manufacturing a tunnel field-effect transistor that is provided in this embodiment of the present application further includes the following step:

Step S7: Form a sidewall on a surface of the gate structure 50. A process of the sidewall is well known to a person skilled in the art, and therefore is not described in detail in the present application.

It should be noted that, in this embodiment of the present application, the sidewall may be silicon oxide, silicon nitride, high-K dielectric, or another insulation material. This is not limited in the present application, and is specifically determined according to a situation.

In addition, the method for manufacturing a tunnel field-effect transistor that is provided in this embodiment of the present application further includes forming a gate electrode electrically connected to the gate structure 50, a source region electrode electrically connected to the source region 30, a drain region electrode electrically connected to the drain region 70, and the like in the tunnel field-effect transistor, which is similar to a process such as metallic contact in a CMOS, so as to form a complete transistor. This part is the same as the prior art and is well known to a person skilled in the art, and therefore is not described in detail in the present application.

It should be noted that, in process steps provided in any one of the foregoing embodiments of the present application, each deposition process used in the process steps may be a low pressure chemical vapor deposition process, a physical vapor deposition process, or another deposition process. This is not limited in the present application.

It should be further noted that, in the manufacturing method provided in any one of the foregoing embodiments of the present application, materials of mask layers (for example, the first mask layer and the second mask layer) used in the process steps may be a silicon oxide material, silicon nitride material, or a silicon oxynitride material. This is not limited in the present application either, and is specifically determined according to a situation.

It may be learned from the foregoing description that, the method for manufacturing a tunnel field-effect transistor that is provided in this embodiment of the present application mainly includes the deposition process and the photoresist process, and does not need an extremely complicated process or technology. The process in the manufacturing method is simple and compatible with a standard process of a COMS device in the prior art.

In conclusion, in the tunnel field-effect transistor and the method for manufacturing a tunnel field-effect transistor that are provided in the embodiments of the present application, the source regions 30 are located on the two sides of the oxide structure 20, the epitaxial layer 40 is located on the surface on the side that is of the source region 30 and that is away from the oxide structure 20, and the gate structure 50 is located on the surface on the side that is of the epitaxial layer 40 and that is away from the source region 30, so that a gate electric field direction of the tunnel field-effect transistor provided in this embodiment of the present application is the same as an electron tunneling direction, and carriers on a valence band of the source region 30 tunnel to a conduction band of the epitaxial layer 40 at relatively high tunneling efficiency, thereby generating a steep subthreshold swing and enabling a subthreshold swing value of the tunnel field-effect transistor provided in this embodiment of the present application to be lower than 60 mV/dec to consume relatively low power.

In addition, in the tunnel field-effect transistor and the method for manufacturing a tunnel field-effect transistor that are provided in the embodiments of the present application, the epitaxial layer 40 is totally located between the gate structure 50 and the source region 30, thereby increasing a tunneling area between the epitaxial layer 40 and the source region 30, further improving a subthreshold feature of the tunnel field-effect transistor, and reducing the subthreshold swing value of the tunnel field-effect transistor.

In addition, in the tunnel field-effect transistor and the method for manufacturing a tunnel field-effect transistor that are provided in the embodiments of the present application, the channel layers 60 are located on the two sides of the oxide structure 20, and the drain region 70 is located on the end face on the side that is of the oxide structure 20 and that is away from the substrate 10, so that a leakage current is prevented from being generated between the drain region 70 and the channel layer 60 when a voltage is applied on a side that is of the gate structure 50 and that is away from the epitaxial layer 40, thereby reducing a shutdown current and further reducing power consumption of the tunnel field-effect transistor.

The parts in this specification are all described in a progressive manner, for same or similar parts, reference may be made to these parts, and each part focuses on a difference from other parts.

The embodiments disclosed above are described to enable a person skilled in the art to implement or use the present application. Various modifications to the embodiments are obvious to the person skilled in the art, and general principles defined in this specification may be implemented in other embodiments without departing from the spirit or scope of the present application. Therefore, the present application will not be limited to the embodiments described in this specification but extends to the widest scope that complies with the principles and novelty disclosed in this specification.

What is claimed is:

1. A tunnel field-effect transistor, comprising:
a substrate;
an oxide structure, wherein the oxide structure is located on a surface of the substrate;
insulation layers, wherein the insulation layers are located on the surface of the substrate and two sides of the oxide structure;
source regions, wherein the source regions are located on surfaces of the insulation layers and the two sides of the oxide structure, and an end face on an end that is of the source region and that is away from the substrate is lower than an end face on a side that is of the oxide structure and that is away from the substrate;
epitaxial layer, wherein the epitaxial layer is located on the surface of the insulation layer and a surface on a side that is of the source region and that is away from the oxide structure, and an end face on a side that is of the epitaxial layer and that is away from the substrate is flush with an end face on a side that is of the source region and that is away from the substrate;
a gate structure, wherein the gate structure is located on the surface of the insulation layer and a surface on a side that is of the epitaxial layer and that is away from the source region;
channel layers, wherein the channel layers are located on the two sides of the oxide structure and cover the source regions and the epitaxial layer, and an end face on a side that is of the channel layer and that is away from the substrate is flush with the end face on the side that is of the oxide structure and that is away from the substrate; and
a drain region, wherein the drain region covers the oxide structure and the channel layers.

2. The tunnel field-effect transistor according to claim 1, wherein in a direction from the source region to the epitaxial layer, a thickness of the source region is 10 nm to 30 nm, and endpoint values are comprised.

3. The tunnel field-effect transistor according to claim 1, wherein the gate structure comprises:
  a gate dielectric layer, wherein the gate dielectric layer is located on the surface of the insulation layer and the surface on the side that is of the epitaxial layer and that is away from the source region; and
  a gate electrode layer, wherein the gate electrode layer is located on a surface on a side that is of the gate dielectric layer and that is away from the insulation layer and the epitaxial layer.

4. The tunnel field-effect transistor according to claim 1, wherein the oxide structure is a nanowire structure or a square pillar structure.

5. A method for manufacturing a tunnel field-effect transistor, wherein the method comprises:
  providing a substrate;
  forming an oxide structure on a surface of the substrate;
  forming insulation layers in regions that are located on two sides of the oxide structure on the surface of the substrate;
  forming source regions and epitaxial layers on surfaces of the insulation layers, wherein the source regions are located on the two sides of the oxide structure, the epitaxial layer is located on a surface on a side that is of the source region and that is away from the oxide structure, an end face on a side that is of the epitaxial layer and that is away from the substrate is flush with an end face on a side that is of the source region and that is away from the substrate, and both the end face on the side that is of the epitaxial layer and that is away from the substrate and the end face on the side that is of the source region and that is away from the substrate are lower than an end face on a side that is of the oxide structure and that is away from the substrate;
  forming, on the side that is of the source region and that is away from the substrate, a channel layer that covers the source region and the epitaxial layer, wherein the channel layers are located on the two sides of the oxide structure, and an end face on a side that is of the channel layer and that is away from the substrate is flush with the end face on the side that is of the oxide structure and that is away from the substrate;
  forming, on the side that is of the oxide structure and that is away from the substrate, a drain region that covers the oxide structure and the channel layers; and
  forming a gate structure on the surface of the insulation layer, wherein the gate structure is located on a surface on a side that is of the epitaxial layer and that is away from the source region.

6. The manufacturing method according to claim 5, wherein the forming an oxide structure on a surface of the substrate comprises:
  forming a nitride layer on the surface of the substrate;
  forming, on a surface of the nitride layer, a mask layer that has a preset through hole;
  etching the nitride layer by using the mask layer as a mask, to form a through hole in the nitride layer, and expose a part of the surface of the substrate, wherein the through hole is corresponding to a region of the preset through hole in the mask layer;
  forming the oxide structure in the through hole; and
  removing the nitride layer and the mask layer.

7. The manufacturing method according to claim 6, wherein a formation process of the oxide structure is a selective epitaxial process.

8. The manufacturing method according to claim 5, wherein the forming an oxide structure on a surface of the substrate comprises:
  forming an oxide layer on the surface of the substrate;
  forming, on a surface of the oxide layer, a mask layer that has a preset through hole;
  etching the oxide layer by using the mask layer as a mask, and retaining a part of the oxide layer as the oxide structure; and
  removing the mask layer.

9. The manufacturing method according to claim 5, wherein the forming source regions and epitaxial layers on surfaces of the insulation layers, wherein the source regions are located on the two sides of the oxide structure, the epitaxial layer is located on a surface on a side that is of the source region and that is away from the oxide structure, an end face on a side that is of the epitaxial layer and that is away from the substrate is flush with an end face on a side that is of the source region and that is away from the substrate, and both the end face on the side that is of the epitaxial layer and that is away from the substrate and the end face on the side that is of the source region and that is away from the substrate are lower than an end face on a side that is of the oxide structure and that is away from the substrate comprises:
  forming a first semiconductor layer on an upper surface of the insulation layer, an upper surface of the oxide structure, and surfaces on the two sides of the oxide structure, wherein the first semiconductor layer is a P-type doped semiconductor layer;
  forming a second semiconductor layer on a surface of the first semiconductor layer;
  etching the second semiconductor layer and the first semiconductor layer, and removing parts that are of the second semiconductor layer and the first semiconductor layer and that are located on the surface of the insulation layer and the upper surface of the oxide structure;
  forming first mask layers on surfaces that are of the insulation layers and that are located on two sides of the second semiconductor layer, wherein an end face on a side that is of the first mask layer and that is away from the substrate is flush with an end face on a side that is of the second semiconductor layer and that is away from the oxide structure;
  etching the first mask layer until the end face on the side that is of the first mask layer and that is away from the substrate is lower than the end face on the side that is of the oxide structure and that is away from the substrate;
  forming a second mask layer on a surface of the first mask layer, wherein the second mask layer covers the first semiconductor layer, the second semiconductor layer, and the first mask layer;
  etching the second mask layer, to expose end faces on sides that are of the first semiconductor layer and the second semiconductor layer and that are away from the oxide structure; and
  etching the second semiconductor layer and the first semiconductor layer until end faces on sides that are of the second semiconductor layer and the first semiconductor layer and that are away from the substrate are lower than an end face on a side of the oxide structure, to form the source region and the epitaxial layer.

10. The manufacturing method according to claim 5, wherein the forming, on the side that is of the source region and that is away from the substrate, a channel layer that covers the source region and the epitaxial layer, wherein the channel layers are located on the two sides of the oxide structure, and an end face on a side that is of the channel layer and that is away from the substrate is flush with the end face on the side that is of the oxide structure and that is away from the substrate comprises:

forming, by using the second mask layer as a mask, a third semiconductor layer on the side that is of the source region and that is away from the substrate, wherein the third semiconductor layer covers surfaces on sides that are of the source region, the epitaxial layer, and the oxide structure and that are away from the substrate; and etching the third semiconductor layer by using the second mask layer as a mask until the end face on the side that is of the oxide structure and that is away from the substrate is exposed, to form the channel layer, wherein an end face on a side that is of the third semiconductor layer and that is away from the substrate is flush with the end face on the side that is of the oxide structure and that is away from the substrate.

11. The manufacturing method according to claim 5, wherein the forming, on the side that is of the oxide structure and that is away from the substrate, a drain region that covers the oxide structure and the channel layers comprises:

forming a fourth semiconductor layer as the drain region on end faces on sides that are of the channel layer and the oxide structure and that are away from the substrate, wherein an end face on a side that is of the fourth semiconductor layer and that is away from the substrate is flush with an end face on a side that is of the second mask layer and that is away from the substrate.

* * * * *